(12) United States Patent
Tomita

(10) Patent No.: US 8,775,853 B2
(45) Date of Patent: Jul. 8, 2014

(54) DEVICE AND METHOD FOR PREVENTING LOST SYNCHRONIZATION

(71) Applicant: Fujitsu Limited, Kawasaki (JP)

(72) Inventor: Masato Tomita, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/863,946

(22) Filed: Apr. 16, 2013

(65) Prior Publication Data

US 2013/0243139 A1 Sep. 19, 2013

Related U.S. Application Data

(63) Continuation of application No. 12/184,075, filed on Jul. 31, 2008, now Pat. No. 8,504,862, which is a continuation-in-part of application No. 12/034,410, filed on Feb. 20, 2008, now abandoned.

(30) Foreign Application Priority Data

Feb. 20, 2007 (JP) .................. 2007-039704
Feb. 13, 2008 (JP) .................. 2008-032295

(51) Int. Cl.
G06F 1/12 (2006.01)
G06F 13/42 (2006.01)
H04L 5/00 (2006.01)
H04L 7/00 (2006.01)

(52) U.S. Cl.
USPC ........... 713/400; 713/500; 713/501; 713/503; 713/600

(58) Field of Classification Search
USPC ............ 713/400, 500, 501, 503, 600
See application file for complete search history.

(56) References Cited

U.S. PATENT DOCUMENTS 5,740,517 A 4/1998 Aoshima 6,885,867 B2 4/2005 Matsuoka
7,135,905 B2 11/2006 Teo et al.
7,205,852 B2 4/2007 Perrott (Continued)

FOREIGN PATENT DOCUMENTS

JP 62-253224 A 11/1987
JP 08-331118 A 12/1996

(Continued)

OTHER PUBLICATIONS

Office Action mailed Sep. 4, 2012 in Japanese application No. 2008-032295.

(Continued)

*Primary Examiner* — Jaweed A Abbaszadeh
(74) *Attorney, Agent, or Firm* — Sterne, Kessler, Goldstein & Fox P.L.L.C.

(57) ABSTRACT

A method for synchronizing two connection nodes by a reception node of the connection nodes with a clock data recovery circuit that generates a synchronization clock from input data. The method includes performing a synchronization process to establish synchronization between the connection nodes based on the synchronization clock, performing a connection failure process when the synchronization is not established when a first time elapses after receiving the input data, correcting the clock data recovery circuit when the synchronization is not established when a second time elapses after receiving the input data, wherein the second time is shorter than the first time, and performing a resynchronization process to establish synchronization between the connection nodes based on a synchronization clock, which is generated by the clock data recovery circuit that has been corrected, before the first time elapses and after the second time elapses.

16 Claims, 15 Drawing Sheets

(56) References Cited

U.S. PATENT DOCUMENTS

| | | |
|---|---|---|
| 7,457,391 B2 | 11/2008 | Gregorius et al. |
| 7,532,038 B2 | 5/2009 | Lin |
| 7,620,136 B2 | 11/2009 | Sanders et al. |
| 7,676,013 B2 | 3/2010 | Nishimura |
| 7,738,617 B1 | 6/2010 | Fortin et al. |
| 7,983,370 B2 | 7/2011 | Wada |
| 8,050,647 B2 | 11/2011 | Ibrahim et al. |
| 2004/0158420 A1 | 8/2004 | Kim et al. |
| 2006/0045176 A1 | 3/2006 | Moughabghab et al. |
| 2006/0062341 A1 | 3/2006 | Edmondson et al. |
| 2007/0071455 A1 | 3/2007 | Margalit et al. |
| 2007/0230966 A1 | 10/2007 | Walsh |
| 2008/0111633 A1 | 5/2008 | Cranford et al. |

FOREIGN PATENT DOCUMENTS

| | | |
|---|---|---|
| JP | 11-341087 A | 12/1999 |
| JP | 2005-039638 A | 2/2005 |
| JP | 2005-150890 A | 6/2005 |
| JP | 2005-257376 A | 9/2005 |

OTHER PUBLICATIONS

Office Action mailed Dec. 5, 2013 in U.S. Appl. No. 13/927,831.

Notice of Allowance mailed Apr. 4, 2013 in U.S. Appl. No. 12/184,075.

Final Office Action mailed Nov. 21, 2012 in U.S. Appl. No. 12/184,075.

Office Action mailed Apr. 12, 2012 in U.S. Appl. No. 12/184,075.

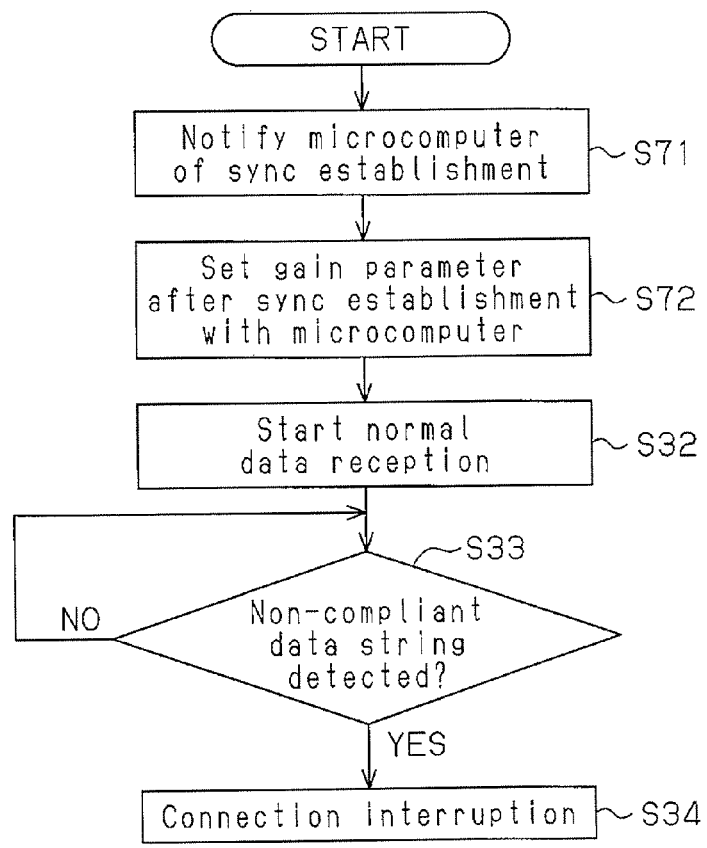

DEVICE AND METHOD FOR PREVENTING LOST SYNCHRONIZATION

CROSS-REFERENCE TO RELATED APPLICATIONS

This application is a continuation application of pending U.S. patent application Ser. No. 12/184,075 filed on Jul. 31, 2008, which is a continuation-in-part application of U.S. patent application Ser. No. 12/034,410 filed on Feb. 20, 2008, entitled "DEVICE AND METHOD FOR PREVENTING LOST SYNCHRONIZATION".

FIELD

This application relates to a method and device for preventing lost synchronization.

BACKGROUND

The processing and transfer of mass data at high speeds have become necessary in recent years. This has resulted in the necessity for high-speed interfaces. A high-speed interface that enables the transfer of data in a Gbps band does not transfer data in synchronization with a clock (synchronous data transfer) as in a conventional manner. Rather, a high-speed interface is required to perform non-synchronous transfer. Accordingly, a reception node must have a clock data recovery (CDR) circuit that generates a clock (synchronization clock) synchronized with the received data.

Japanese Laid-Open Patent Publication No. 2005-150890 (paragraph 0026 and FIGS. 1 and 3) describes such a CDR circuit. The CDR circuit, which has an analog circuit configuration, increases the response sensitivity when the phase difference between the clock and data is large and decreases the response sensitivity when the phase difference between the clock and data is small. However, a CDR circuit having an analog configuration is not appropriate for a high-speed interface.

Japanese Laid-Open Patent Publication No. 2005-257376 (FIG. 1) describes a CDR circuit including a phase comparator, a serial/parallel converter, and a digital filter. The CDR circuit uses a digital filter in lieu of a low-pass filter (LPF) that is used in the CDR circuit of Japanese Laid-Open Patent Publication No. 2005-150890.

FIG. 1 is a block diagram showing the circuit configuration of a conventional serial interface, such as IEEE1394.b, together with the flow of data. As shown in FIG. 1, a transmission node 80 includes a parallel/serial converter 81 and a transmitter 82. The parallel/serial converter 81 converts parallel transmission data to serial transmission data and provides the converted data to the transmitter 82. The transmitter 82 transmits the transmission data as differential serial data from the parallel/serial converter 81 to a reception node 90.

The reception node 90 includes a receiver 91, a CDR circuit 92, and a serial/parallel converter 93. The receiver 91 provides the CDR circuit 92 with the differential serial data transferred from the transmission node 80 (transmitter 82) as single end serial data. The CDR circuit 92 generates a clock synchronized with the single end serial data, or received data. Further, the CDR circuit 92 synchronizes the single end serial data with the synchronization clock to generate synchronized serial data. The serial/parallel converter 93 converts the synchronized serial data generated by the CDR circuit 92 into parallel data, which is provided to various processing circuits in the following stage.

When an internal circuit of the reception node 90 is affected by noise or the like and fails to function normally, the synchronization clock may not be properly generated even though data reception is started. In such a case, the communication between connection nodes (i.e., the transmission node 80 and the reception node 90) may be interrupted. Further, even when the synchronization clock is properly generated and data transfer is started, the clock synchronization may be lost during the data transfer. This may interrupt communication between connection nodes.

FIG. 2 is a flowchart showing synchronization procedures for the reception node 90 in the prior art. A serial interface, such as IEEE1394.b, transmits and receives synchronization data to perform synchronization between connection nodes. The reception node 90 receives the synchronization data (step S91).

The synchronization data includes a synchronization detection character code line (hereafter simply referred to as character code line). The reception node 90 detects the character code line. Then, when receiving the synchronization data in a normal manner over a given time, the reception node 90 determines that synchronization has been established with a peer node, namely, the transmission node 80. The CDR circuit 92 generates a synchronization clock when determining synchronization establishment.

More specifically, the reception node 90 starts a process for detecting a character code line when, for example, the transmission node 80 starts to transmit data and then checks whether or not synchronization data has been normally received over a given period (step S92). During a given synchronization detection time N, if a character code line cannot be detected and synchronization data cannot be received over the given period, the reception node 90 performs a connection failure process (step S93). During the synchronization detection time N, if a character code line is detected and synchronization data is received, the reception node 90 acknowledges establishment of synchronization and starts normal data reception (step S94). The synchronization detection time N is determined in accordance with the data transfer standard (e.g., several tens of milliseconds for IEEE1394.b).

After normal data reception starts, the reception node 90 constantly determines whether the received data is a string of data that does not comply with the data transfer standard (step S95). When determining that a non-compliant data string has been received, the reception node 90 determines that synchronization has been lost and performs a connection interruption process (step S96). A non-compliant data string refers to a data string that is not specified by the data transfer standard. For example, in IEEE1394.b, lost synchronization is determined when a data pattern is not generated through 8B/10B encoding.

A defect that occurs in the CDR circuit 92 may hinder the establishment of synchronization between connection nodes. In such a case, even though the CDR circuit 92 generates the synchronization clock within a shorter period than the synchronization detection time N, communication failure would be determined only after the detection time N elapses. This would be a waste of time.

Further, even if synchronization is established between connection nodes, noise may seriously affect the CDR circuit 92 such that synchronization is lost and connection nodes are disconnected.

SUMMARY

One aspect of the embodiments is a method for synchronizing two connection nodes by a reception node of the connection nodes with a clock data recovery circuit that generates a synchronization clock from input data. The method includes performing a synchronization process to establish synchronization between the connection nodes based on the synchronization clock, performing a connection failure process when the synchronization is not established when a first time elapses after receiving the input data, correcting the clock data recovery circuit when the synchronization is not established when a second time elapses after receiving the input data, wherein the second time is shorter than the first time, and performing a resynchronization process to establish synchronization between the connection nodes based on a synchronization clock, which is generated by the clock data recovery circuit that has been corrected, before the first time elapses and after the second time elapses.

Additional objects and advantages of the embodiments will be set forth in part in the description which follows, and in part will be obvious from the description, or may be learned by practice of the embodiments. The objects and advantages of the embodiments will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which:

FIG. 18 is a flowchart of a process for preventing lost synchronization performed by the device shown in FIG. 17.

DESCRIPTION OF THE EMBODIMENTS

Figure 1:
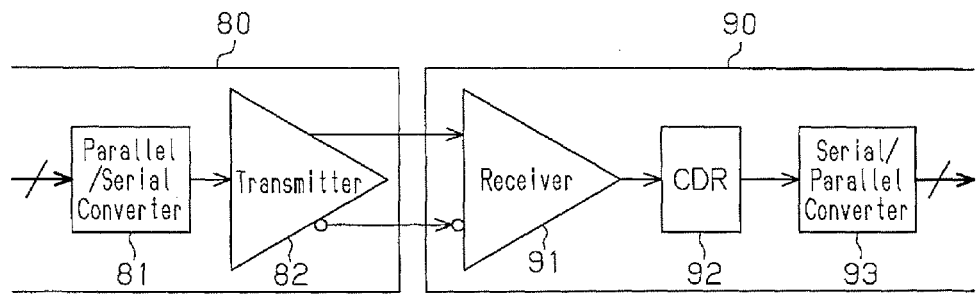
FIG. 1 is a schematic block circuit diagram showing a transmission node and a reception node in a serial interface of the prior art.
Figure 2:
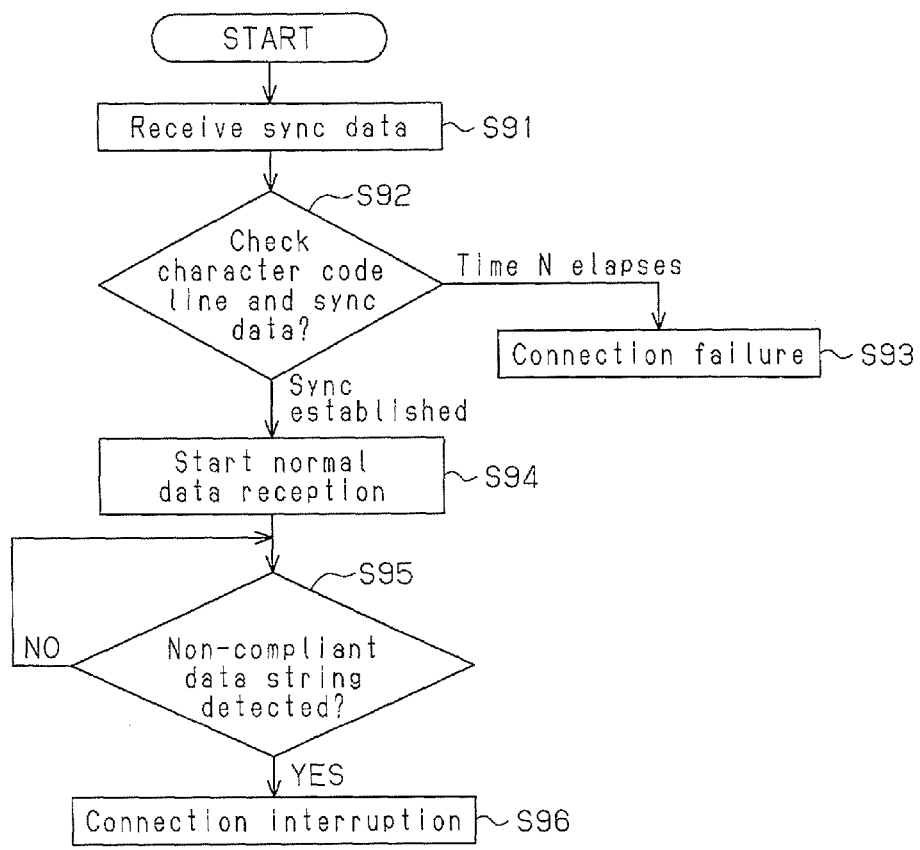
FIG. 2 is a schematic flowchart of a synchronization process performed on the reception node of FIG. 1.

According to an aspect of one embodiment, a method and device for preventing non-establishment of synchronization between connection nodes that would occur due to a CDR circuit defect and for preventing connection failures is provided.

According to a further aspect of one embodiment, a method and device for preventing noise from affecting a CDR circuit and for preventing lost synchronization from disconnecting connection nodes is provided.

In the drawings, like numerals are used for like elements throughout.

A device and method that prevent lost synchronization in accordance with a first embodiment will now be discussed with reference to the drawings.

Figure 7:
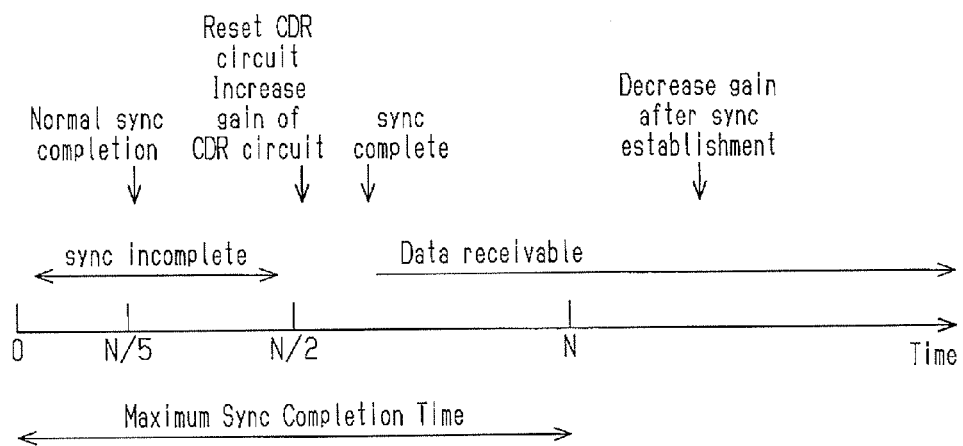
FIG. 7 is a schematic time chart showing the procedures of a synchronization process.

FIG. 7 is a time chart showing the procedures of a synchronization process from when a reception node starts to receive data in an interface that generates a clock from received data, such as IEEE1394.b. As shown in FIG. 7, in such an interface, the maximum period from when data reception is started to when clock synchronization is completed (referred to as maximum synchronization completion time in FIG. 7) is defined as a synchronization detection time N (first time period). If synchronization between connection nodes (i.e., transmission node and reception node) is not established when the synchronization detection time N from when data reception is started elapses, a connection failure process is performed. The synchronization detection time N is determined in accordance with the data transfer standard (e.g., several tens of milliseconds for IEEE1394.b).

Figure 8:
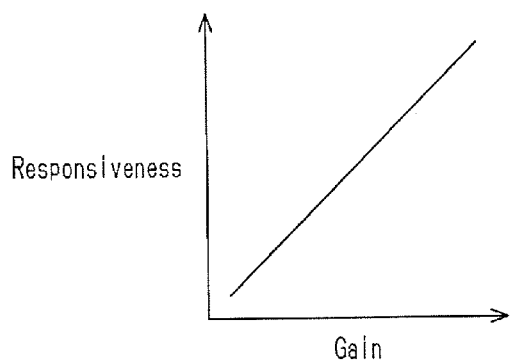
FIG. 8 is a schematic graph showing the relationship between the gain and responsiveness of the CDR circuit.

A CDR circuit is capable of generating a synchronization clock within a period that is significantly shorter than the detection time N in a normal state, for example, within one fifth of the detection time N (time N/5). When synchronization with the synchronization clock does not be established between connection nodes within one half of the detection time N (synchronization retry time N/2), which is shorter than the detection time N but longer than the time N/5, there may be a defect in the CDR circuit. Accordingly, if synchronization does not be established between connection nodes, the CDR circuit is reset when the retry determination time N/2 elapses in the first embodiment. Further, if synchronization does not be established between connection nodes, there is a possibility that the CDR circuit is not responsive to the received data. Thus, the gain, or response sensitivity, of the CDR circuit is increased. FIG. 8 is a graph showing the relationship between the gain and responsiveness of the CDR circuit. As apparent from FIG. 8, the responsiveness of the CDR circuit is improved as the gain increases. This shows that an increase in gain when starting data reception is advantageous for the synchronization of connection nodes.

Figure 3:
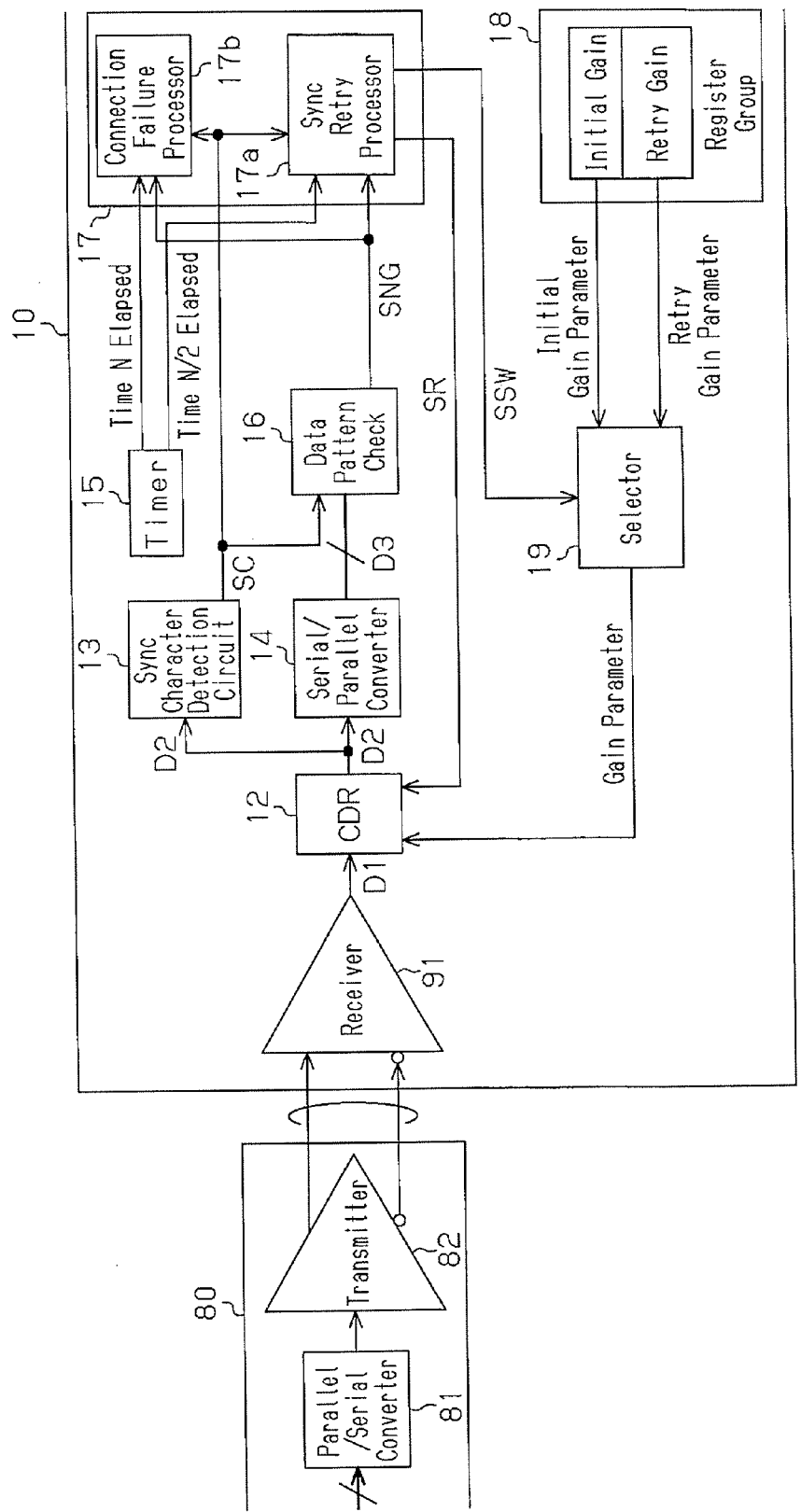
FIG. 3 is a schematic block circuit diagram of a device that prevents lost synchronization according to a first embodiment.

FIG. 3 is a block circuit diagram of a circuit configuration that mainly performs a synchronization retry process for a serial interface, such as IEEE1394.b. FIG. 3 shows a transmission node 80, which is identical to that of the conventional circuit shown in FIG. 1. Thus, the transmission node 80 will not be described below.

A reception node 10 includes a receiver 11, a CDR circuit 12, a synchronization character detection circuit 13 (synchronization detection circuit), a serial/parallel converter 14, a timer circuit 15 for performing time management, a data pattern check circuit 16, and a sequencer 17 for performing various controls such as the control of processing procedures in accordance with each situation.

The receiver 11 receives differential serial data from the transmission node 80 (transmitter 82) and provides the differential serial data as single end serial data D1 to the CDR circuit 12.

The CDR circuit 12 generates a synchronization clock, which is synchronized with the received data, or the single end serial data D1, from the receiver 11. Further, the CDR circuit 12 synchronizes the single end serial data D1 with the synchronization clock and provides synchronized serial data D2 to the synchronization character detection circuit 13 and the serial/parallel converter 14.

The synchronization character detection circuit 13 detects a synchronization detection character code line (hereafter simply referred to as character code line) from the serial data D2 and provides a synchronization character detection signal SC to the data pattern check circuit 16 and the sequencer 17. The character code line is determined in accordance with the data transfer standard and included in the data that is transmitted and received between connection nodes to perform synchronization (synchronization data).

The serial/parallel converter 14 converts the synchronization serial data D2 to parallel data D3. Then, the serial/parallel converter 14 provides the parallel data D3 to the data pattern check circuit 16.

The data pattern check circuit 16 constantly checks whether or not the parallel data D3 is a string of data that does not comply with the data transfer standard, that is, NG data. If NG data is detected, the data pattern check circuit 16 provides a detection signal SNG (data string detection signal) to the sequencer 17. A non-compliant data string refers to a data string that is not specified by the data transfer standard. For example, in IEEE1394.b, lost synchronization is determined when a data pattern is not generated through 8B/10B encoding.

The sequencer 17 incorporates a synchronization retry processor 17a (correction processor) and a connection failure processor 17b, which receive the synchronization character detection signal SC and the NG data detection signal SNG.

The retry processor 17a further receives from the timer circuit 15 a first signal, which indicates whether a retry determination time N/2 has elapsed. When the retry determination time N/2 elapses, if a character code line is not detected or if a character code line is detected but NG data is also detected, the retry processor 17a provides the CDR circuit 12 with a reset signal SR. The CDR circuit 12 starts the synchronization process again from the beginning when receiving the reset signal SR. In response to the reset signal SR, the CDR circuit 12 resets the data stored in the CDR circuit 12 to an initial state. This increases the possibility of a defect in the CDR circuit 12 being eliminated before the synchronization detection time N elapses and increases the possibility of synchronization establishment between connection nodes.

The connection failure processor 17b receives from the timer circuit 15 a second signal, which indicates whether the synchronization detection time N has elapsed. When the detection time N elapses, if the character code line is not detected or if the character code line is detected but NG data is also detected, the connection failure processor 17b determines that synchronization has been lost. In this case, the connection failure processor 17b performs a connection failure process. More specifically, when synchronization between connection nodes is not established, the connection failure processor 17b stops the communication of data with the peer node 80.

Instead of or in lieu of resetting the CDR circuit 12 as described above, a parameter related with the gain (response sensitivity) of the CDR circuit 12 may be changed. As shown in FIG. 3, the reception node 10 may include a register group 18 and a selector 19. The register group 18 holds an initial gain parameter and a retry gain parameter of the CDR circuit 12. The selector 19 selects either one of the gain parameters. The initial gain parameter is selected when the CDR circuit 12 is in an initial state and is a value that is smaller than the retry gain parameter. When the retry determination time N/2 elapses, if a character code line is not detected or if a character code line is detected but NG data is also detected, the retry processor 17a switches the gain value set for the CDR circuit 12 from the initial gain parameter to the retry gain parameter to increase the gain of the CDR circuit 12. More specifically, in response to a gain switching signal SSW from the retry processor 17a, the selector 19 switches the initial gain parameter, which is selected when the synchronization process is started, to the retry gain parameter. As a result, when a synchronization retry process is performed, the retry gain parameter, which is larger than the initial gain parameter, is set for the CDR circuit 12. This increases the possibility of a defect in the CDR circuit 12 being eliminated before the detection time N elapses and increases the possibility of synchronization establishment between connection nodes.

When the switching of the gain parameter for the CDR circuit 12 with the retry processor 17a and the resetting of the CDR circuit 12 are both performed, it is preferred that these processes be performed in time series. For example, the retry processor 17a first switches the gain parameter of the CDR circuit 12 when performing the synchronization retry process. Then, if there are no improvements when a second retry determination time (e.g., 3N/4) elapses, the retry processor 17a further resets the CDR circuit 12. This increases the possibility of a defect in the CDR circuit 12 being eliminated before the synchronization detection time N elapses and increases the possibility of synchronization establishment between connection nodes. The switching of the gain parameter for the CDR circuit 12 with the retry processor 17a and the resetting of the CDR circuit 12 may be simultaneously performed.

Further, even if determined that synchronization between connection nodes has once been established based on the detection of the character code line and the synchronization data, the retry processor 17a may perform the same process (reset process and/or gain parameter changing process) when detecting the detection signal SN of NG data during the synchronization detection time N.

Figure 4:
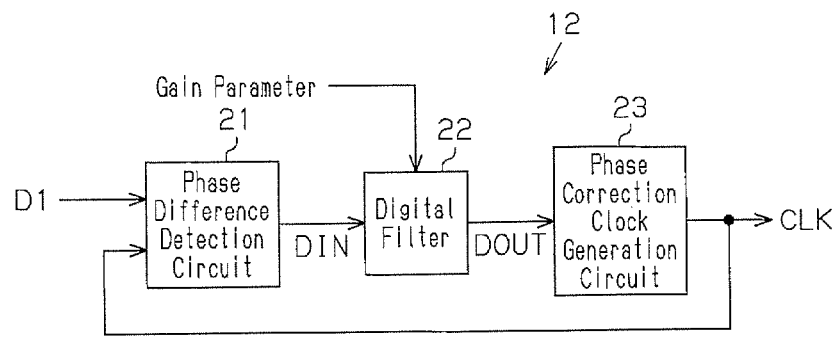
FIG. 4 is a schematic block circuit diagram of a CDR circuit shown in FIG. 3.

A process for generating a synchronization clock with the CDR circuit 12 will now de discussed with reference to the block circuit diagram of FIG. 4. As shown in FIG. 4, the CDR circuit 12 includes a phase difference detection circuit 21, a digital filter 22, and a phase correction clock generation circuit 23.

The phase difference detection circuit 21 determines the phase difference between the single end serial data D1 (received data) and a synchronization clock CLK, which is generated from the single end serial data D1. When the phase is advanced, the phase difference is indicated by a phase difference determination value of, for example, +1. When the phase is retarded, the phase difference is indicated by a phase difference determination value of, for example, −1. Then, the phase difference detection circuit 21 uses an incorporated adder to add a given number of cycles (e.g., ten cycles) of the synchronization clock CLK to the phase difference determination value in order to generate a phase code DIN. The phase difference detection circuit 21 provides the phase code DIN to the digital filter 22. The above-described number of cycles is set, for example, in accordance with the communication rate.

The digital filter 22 obtains the cumulative average of the given number of cycles (e.g., ten cycles) of the synchronization clock CLK for the phase code DIN and provides a digital phase control code DOUT to the phase correction clock generation circuit 23. The response sensitivity (responsiveness) of the digital filter 22 is changed by the gain parameter.

The phase correction clock generation circuit 23 uses the phase control code DOUT to generate a synchronization clock CLK having any one of phases 0 to 2π. For example, when the phase control code DOUT may be any one of 64 possible codes, the clock generation circuit 23 generates as the synchronization clock CLK a clock corresponding to one of phase conditions obtained by dividing 0 to 2π by 64. This synchronization clock CLK is fed back to the phase difference detection circuit 21. The phase difference detection circuit 21 periodically compares the phase of the single end serial data D1 with the phase of the synchronization clock CLK to generate the phase code D1. As described above, the CDR circuit 12 synchronizes the single end serial data D1 with the synchronization clock CLK to generate the synchronized serial data D2.

Figure 5:
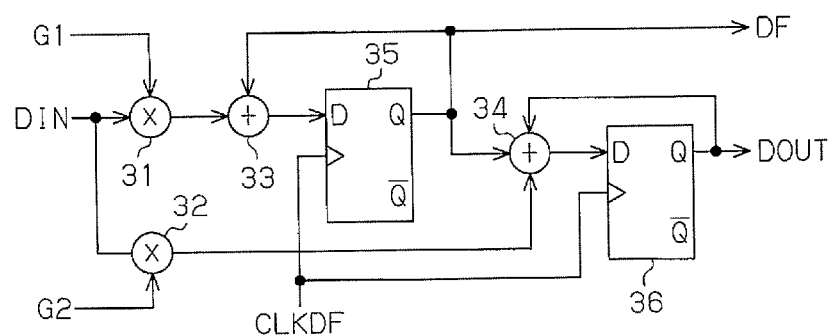
FIG. 5 is a schematic block circuit diagram of a digital filter shown in FIG. 4.

FIG. 5 is a block circuit diagram showing the configuration of the digital filter 22. As shown in FIG. 5, the digital filter 22 includes multipliers 31 and 32, adders 33 and 34, and D flipflops 35 and 36.

The multiplier 31 multiplies the phase code DIN from the phase difference detection circuit 21 by a first gain parameter G1 and provides the product to the adder 33. The multiplier 32 multiplies the phase code DIN from the phase difference detection circuit 21 by a second gain parameter G2 and provides the product to the adder 34. The retry processor 17a changes the second gain parameter G2 to switch the gain parameter of the CDR circuit 12.

Figure 9:
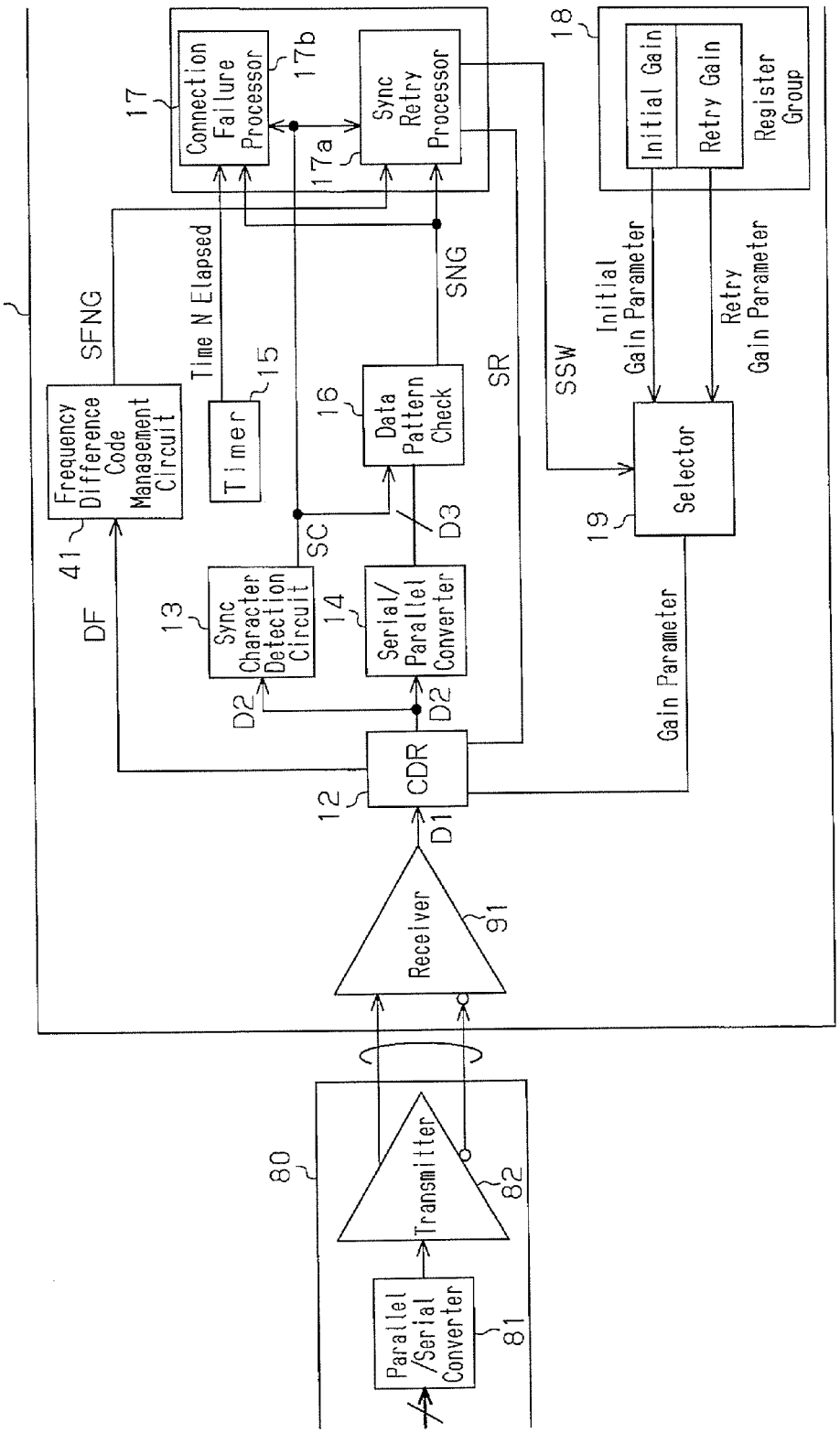
FIG. 9 is a schematic block circuit diagram of a device that prevents lost synchronization according to a second embodiment.

The adder 33 adds the product obtained by the multiplier 31 to the output value of the D flipflop 35 and provides the sum to the D input terminal of the D flipflop 35. The D flipflop 35 generates an output value DF in synchronization with a digital filter clock CLKDF, which is obtained by dividing the synchronization clock CLK into a given number of cycles (e.g., ten cycles). The output value DF of the D flipflop 35 is provided as a frequency difference code DF to an external circuit (e.g., management circuit 41, which will is shown in FIG. 9 and will be described later) of the digital filter 22, and used for gain adjustment of the CDR circuit 12.

The adder 34 adds the product obtained by the multiplier 32, the frequency difference code DF, and the output value DF of the D flipflop and provides the sum to the D input terminal of the D flipflop 36. The D flipflop 36 holds the sum of the adder 34 in synchronization with the digital filter clock CLKDF and generates the phase control code DOUT. As described above, the phase control code DOUT is provided to the clock generation circuit 23 (FIG. 4) and used to generate the synchronization clock CLK. The gain parameters G1 and G2 affect the loop band and jitter characteristics of the CDR circuit 12. Thus, the gain parameters G1 and G2 are set at appropriate values that take into consideration the loop band and jitter characteristics of the CDR circuit 12.

A process for preventing lost synchronization when data reception is started will now be discussed with reference to FIG. 6.

A serial interface, such as IEEE1394.b, transfers and receives synchronization data to establish synchronization between connection nodes. The reception node 10 receives the synchronization data (step S11).

The reception node 10 detects the character code line included in the synchronization data. Afterwards, if the synchronization data is received normally over a given period, the reception node 10 determines that synchronization with a peer node, namely, the transmission node 80, has been established. When determining the establishment of synchronization, the CDR circuit 12 also generates the synchronization clock.

More specifically, the reception node starts a process for detecting a character code line when, for example, starting reception of data from the transmission node 80. Then, the reception node 10 checks whether or not the synchronization data has been normally received over a given period (step S12). When the retry determination time N/2 elapses, if a character code line is not detected or if a character code line is detected but NG data is also detected, the reception node 10 performs a reset process and/or gain parameter changing process on the CDR circuit 12 (step S13).

In this state, the reception node 10 checks the character code line and the synchronization data (step S14). During the detection time N, if a character code line is not detected or if a character code line is detected but NG data is also detected, the reception node 10 performs a connection failure process (step S15).

If a character code line and synchronization data are detected in step S12 or S14, the reception node 10 acknowledges the establishment of synchronization and starts normal data reception (step S16).

Figure 6:
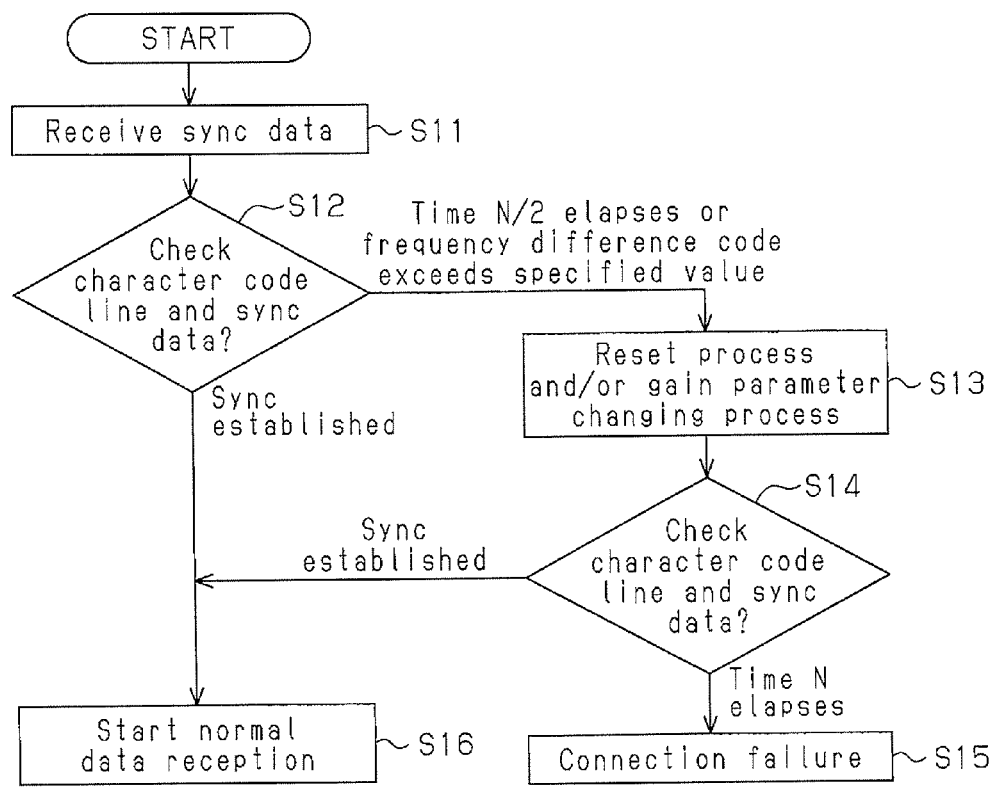
FIG. 6 is a flowchart of a process for preventing lost synchronization performed by the device shown in FIG. 3.

Although not shown in FIG. 6, if NF data is detected within the detection time even after synchronization has been established, the reception node 10 performs a reset process and/or gain parameter changing process on the CDR circuit 12.

The device for preventing lost synchronization according to the first embodiment has the advantages described below.

(1) When synchronization between connection nodes with the clock CLK is not established even though the retry determination time N/2 has elapsed from when reception of received data is started, the operation of the CDR circuit 12 is corrected (reset process and/or gain parameter changing process). This increases the possibility of a defect in the CDR circuit 12 being eliminated within the synchronization detection time N and prevents connection failures.

(2) When the rest process is performed on the CDR circuit 12, the synchronization clock CLK is generated again. This prevents connection failures.

(3) When the gain parameter changing process is performed on the CDR circuit 12, the response sensitivity, or gain, of the CDR circuit 12 is increased to improve the responsiveness. This prevents connection failures.

A device and method for preventing synchronization loss according to a second embodiment will now be discussed with reference to the drawings. The second embodiment differs from the first embodiment in that information of a communication frequency difference (operation frequency difference) between two nodes is used to prevent connection failures.

As described above, the digital filter 22 of the CDR circuit 12 has a two-stage structure as shown in FIG. 5. The frequency difference code DF, which is a parameter related to a communication frequency difference between one node (reception node 10) and a peer node (transmission node 80) is obtained as an output of the first stage, that is, the output of the D flipflop 35. Accordingly, the digital filter 22 functions as a frequency difference detection unit.

As shown in FIG. 9, a management circuit 41, which manages the frequency difference code DF provided from the digital filter 22 of the CDR circuit 12, is added in the reception node 10.

The management circuit 41 constantly checks whether or not the frequency difference code DF has exceeded a specified value. When detecting that the frequency difference code DF has exceeded the specified value, the management circuit 41 provides a detection signal SFNG to the sequencer 17. The specified value of the frequency difference code DF is determined in accordance with the data transfer standard (e.g., ±100 ppm at 500 Mhz).

In the sequencer 17 of the second embodiment, the retry processor 17a receives the detection signal SFNG instead of or in addition to the signal from the timer circuit 15 indicating that the retry determination time N/2 has elapsed. If the frequency difference code DF exceeds the specified value within the detection time N, the retry processor 17a provides a reset signal SR to the CDR circuit in response to the detection signal SFNG in order to start the synchronization process again from the beginning. This increases the possibility of a defect in the CDR circuit 12 being eliminated before the detection time N elapses and increases the possibility of synchronization establishment between connection nodes.

Further, instead of or in addition to resetting the CDR circuit 12, a parameter related with the gain (response sensitivity) of the CDR circuit 12 may be changed. This increases the possibility of a defect in the CDR circuit 12 being eliminated before the detection time N elapses and increases the possibility of synchronization establishment between connection nodes.

In a process for preventing lost synchronization in the second embodiment, as shown in the flowchart of FIG. 6, in step S12, the reset process and/or gain parameter changing process is performed on the CDR circuit 12 when detecting that the frequency difference code DF has exceeded the specified value.

The device for preventing lost synchronization according to the second embodiment has the advantages described below.

(1) When the frequency difference code DF exceeds a given value specified by the communication standard within the detection time N, the operation of the CDR circuit 12 is corrected (reset process and/or gain parameter changing process). This increases the possibility of a defect in the CDR circuit 12 being eliminated within the synchronization detection time N and prevents connection failures.

(2) When the rest process is performed on the CDR circuit 12 in accordance with the detection signal SFNG, the synchronization clock CLK is generated again. This prevents connection failures.

(3) When the gain parameter changing process is performed on the CDR circuit 12 in accordance with the detection signal SFNG, the response sensitivity, or gain, of the CDR circuit 12 is increased to improve the responsiveness. This prevents connection failures.

A device and method for preventing synchronization loss according to a third embodiment will now be discussed with reference to the drawings. In the third embodiment, the response sensitivity, or gain, of the CDR circuit 12 is decreased to prevent the influence of noise.

Figure 10:
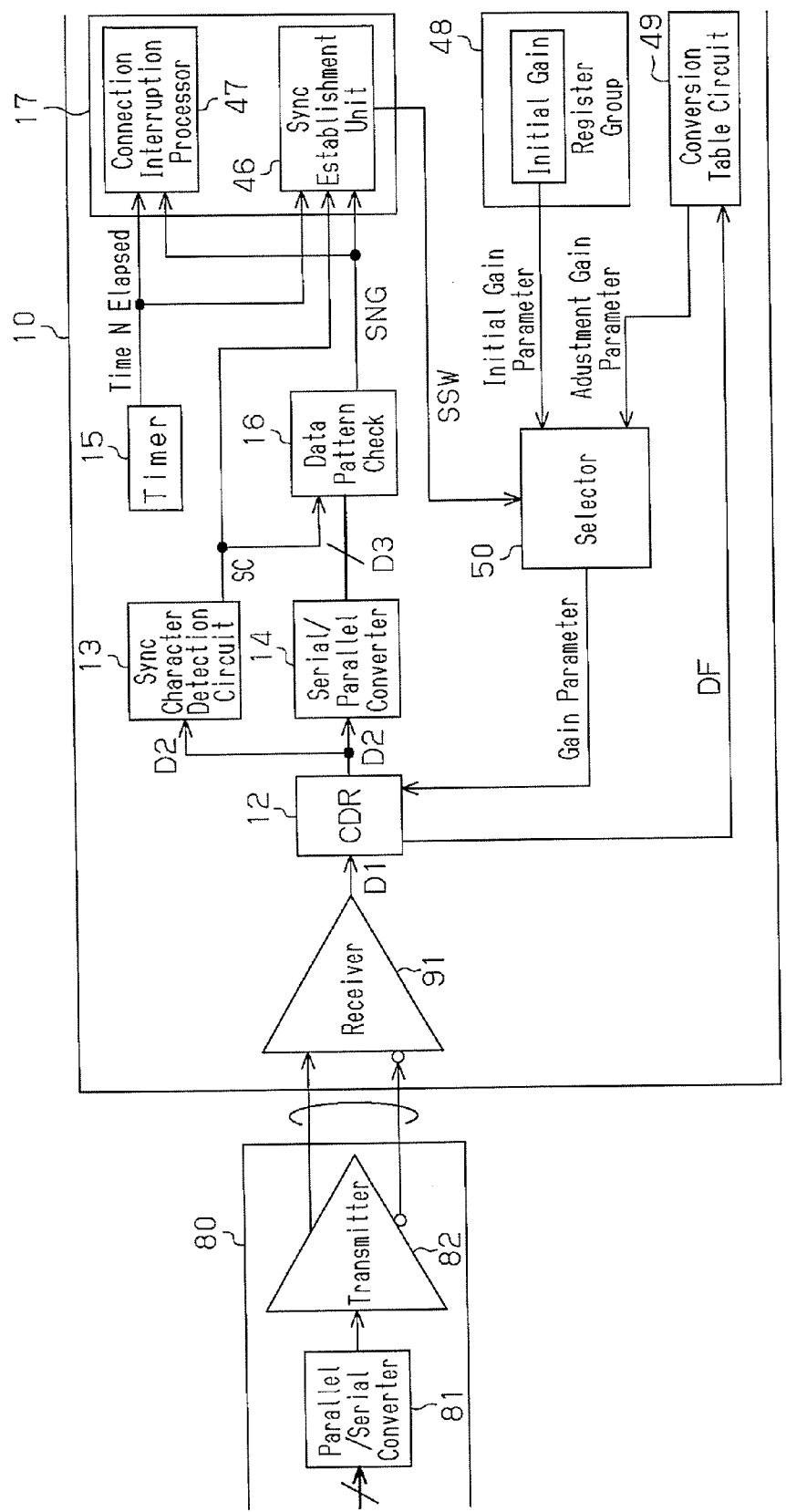
FIG. 10 is a schematic block circuit diagram of a device that prevents lost synchronization according to a third embodiment.

FIG. 10 is a block circuit diagram of a circuit configuration that performs gain adjustment of the CDR circuit 12 mainly after starting normal data reception. As shown in FIG. 10, the sequencer 17 of the third embodiment includes a synchronization establishment unit 46 (response sensitivity changing unit) and a connection interruption processor 47.

The synchronization establishment unit 46 is provided with a synchronization character detection signal SC and a signal from the timer circuit 15 indicating that the detection time N has elapsed. When a character code line and synchronization data are normally detected within the detection time N, the synchronization establishment unit 46 determines that synchronization has been established between connection nodes. This starts normal data reception.

The connection interruption processor 47 is provided with an NG data detection signal SNG and the signal from the timer circuit 15 indicating that the detection time N has elapsed. When detecting the detection signal SNG after the detection time N elapses, the connection interruption processor 47 determines that synchronization has been lost and performs a connection interruption process.

Further, the reception node 10 includes a register group 48, a conversion table circuit 49, and a selector 50. The register group 48 holds an initial gain parameter of the CDR circuit 12 until synchronization is established. The conversion table circuit 49 generates an appropriate gain parameter (adjustment gain parameter) for the CDR circuit 12 after synchronization establishment from the frequency difference code DF, which is generated by the digital filter 22 of the CDR circuit 12. The selector 50 selects either one of the initial gain parameter and the adjustment gain parameter. The conversion table circuit 49 converts the frequency difference code DF to a larger adjustment gain parameter, for example, as the frequency difference code DF becomes larger. However, the conversion table circuit 49 generates the adjustment gain parameter, which is in accordance with the frequency difference code DF, to be smaller than the initial gain parameter.

After synchronization is established within the detection time N, the synchronization establishment unit 46 provides the selector 50 with a gain switching signal SSW to decrease the response sensitivity, or gain, of the CDR circuit 12. In response to the gain switching signal SSW, the selector 50 switches the value of the gain set for the CDR circuit 12, that is, the gain parameter G2 of the digital filter 22, from the initial gain parameter to the adjustment gain parameter. In other words, the selector 50 selects initial gain parameter until synchronization establishment and selects the adjustment gain parameter, which is smaller than the initial gain parameter, after synchronization establishment. As a result, the CDR circuit 12 is less affected by noise after synchronization establishment (refer to FIG. 8).

Since the CDR circuit 12 is less affected by noise after synchronization establishment, connection interruptions are prevented. During the reception of normal data, the adjustment gain parameter is automatically adjusted in accordance with the frequency difference code DF. More specifically, the adjustment gain parameter is decreased by a large amount when the frequency difference code DF is large, and the adjustment gain parameter is decreased by a small amount when the frequency difference code DF is small.

Figure 11:
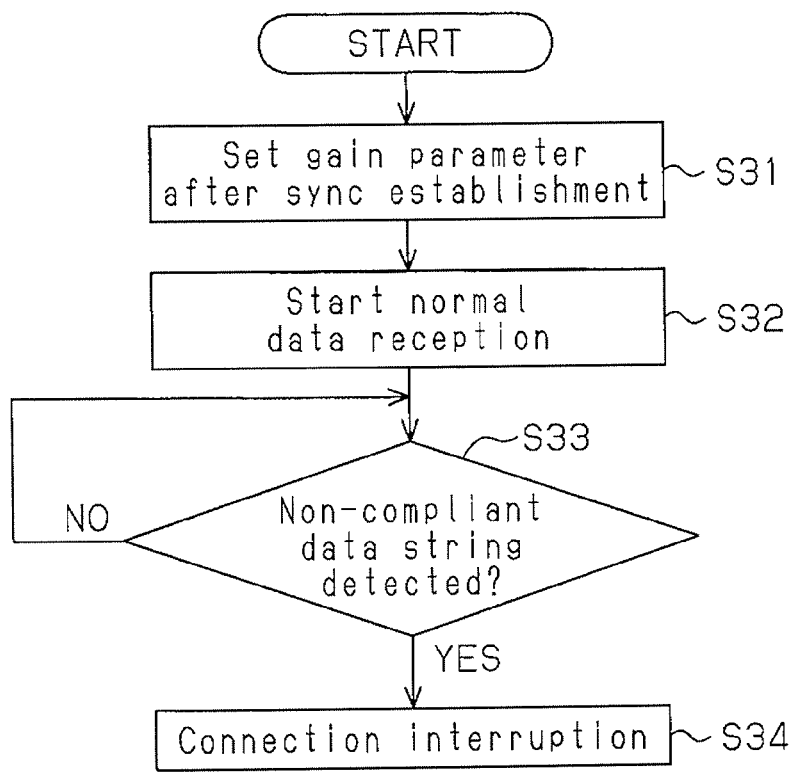
FIG. 11 is a flowchart of a process for preventing lost synchronization performed by the device shown in FIG. 10.

FIG. 11 is a flowchart showing a process for preventing lost synchronization after synchronization establishment between connection nodes. As shown in FIG. 11, after synchronization is established, the reception node 10 sets the gain parameter of the CDR circuit 12 in accordance with the frequency difference code DF (step S31). In this state, the reception node 10 starts normal data reception (step S32).

After normal data reception is started, the reception node 10 constantly checks whether or not the received data is a string of data that does not comply with the data transfer standard, that is, NG data (step S33). When detecting NG data, the reception node 10 determines that synchronization has been lost and performs a connection interruption process (step S34). A non-compliant data string refers to a data string that is not specified by the data transfer standard. For example, in IEEE1394.b, the reception node 10 determines lost synchronization when a data pattern is not generated through 8B/10B encoding.

The device for preventing lost synchronization according to the third embodiment has the advantages described below.

(1) After synchronization establishment, the response sensitivity (gain) of the CDR circuit 12 is decreased, and noise is prevented from affecting the CDR circuit 12. This prevents synchronization from being lost due to the synchronization clock CLK and prevents connection interruptions.

(2) The conversion table circuit 49 adjusts the response sensitivity (gain) of the CDR circuit in accordance with the frequency difference code DF. This automatically adjusts the responsiveness of the CDR circuit 12 and further ensures prevention of connection interruptions.

A device and method for preventing synchronization loss according to a fourth embodiment will now be discussed with reference to the drawings. The fourth embodiment differs from the first and second embodiments in that information on the elapsed time measured by the timer circuit 15 and information on the communication frequency difference between a node and its peer node (operation frequency difference) are used to prevent connection failures.

Figure 12:
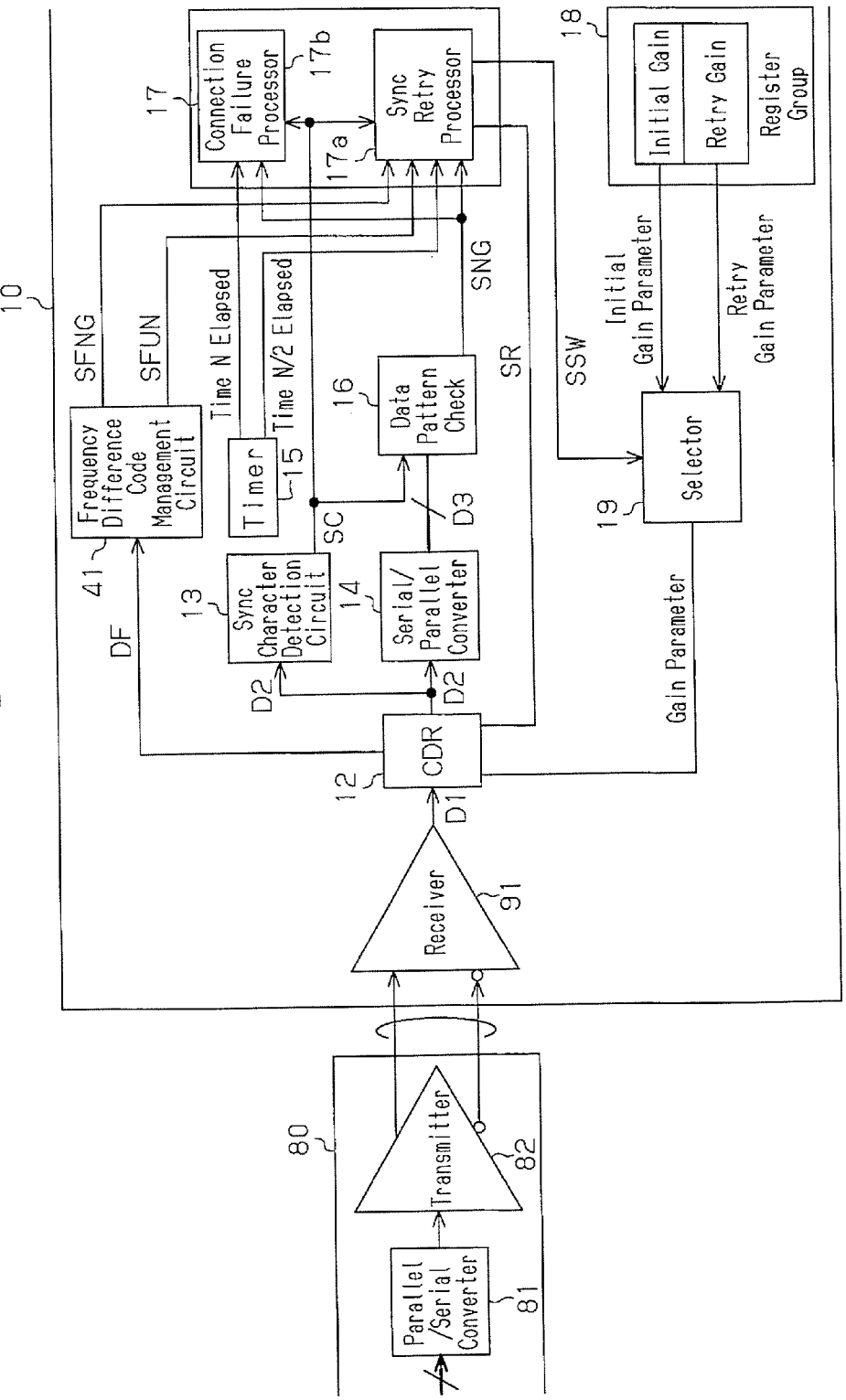
FIG. 12 is a schematic block circuit diagram of a device that prevents lost synchronization according to a fourth embodiment.

The retry processor 17a shown in FIG. 12 differs from that shown in FIG. 9 in that it receives a signal from the timer circuit 15 indicating that the retry determination time N/2 has elapsed and a retry unnecessary signal SFUN from the timer circuit 15. When a frequency difference code DFN is less than a specified value DFN (second specified value), the management circuit 41 outputs the retry unnecessary signal SFUN to the retry processor 17a. The second specified value DFN is specified in accordance with the synchronization capacity of the CDR circuit 12. More specifically, the second specified value DFN is set to a value (e.g., 200 ppm) that is greater than a first specified value (e.g., 100 ppm), which is specified in accordance with the above-described data transfer standard.

When receiving the retry unnecessary signal SFUN, the retry processor 17a does not perform a retry process even if synchronization has not been established after the retry determination time N/2 elapses. In the fourth embodiment, the management circuit 41 and the retry processor 17a function as a correction prohibition unit.

Figure 13:
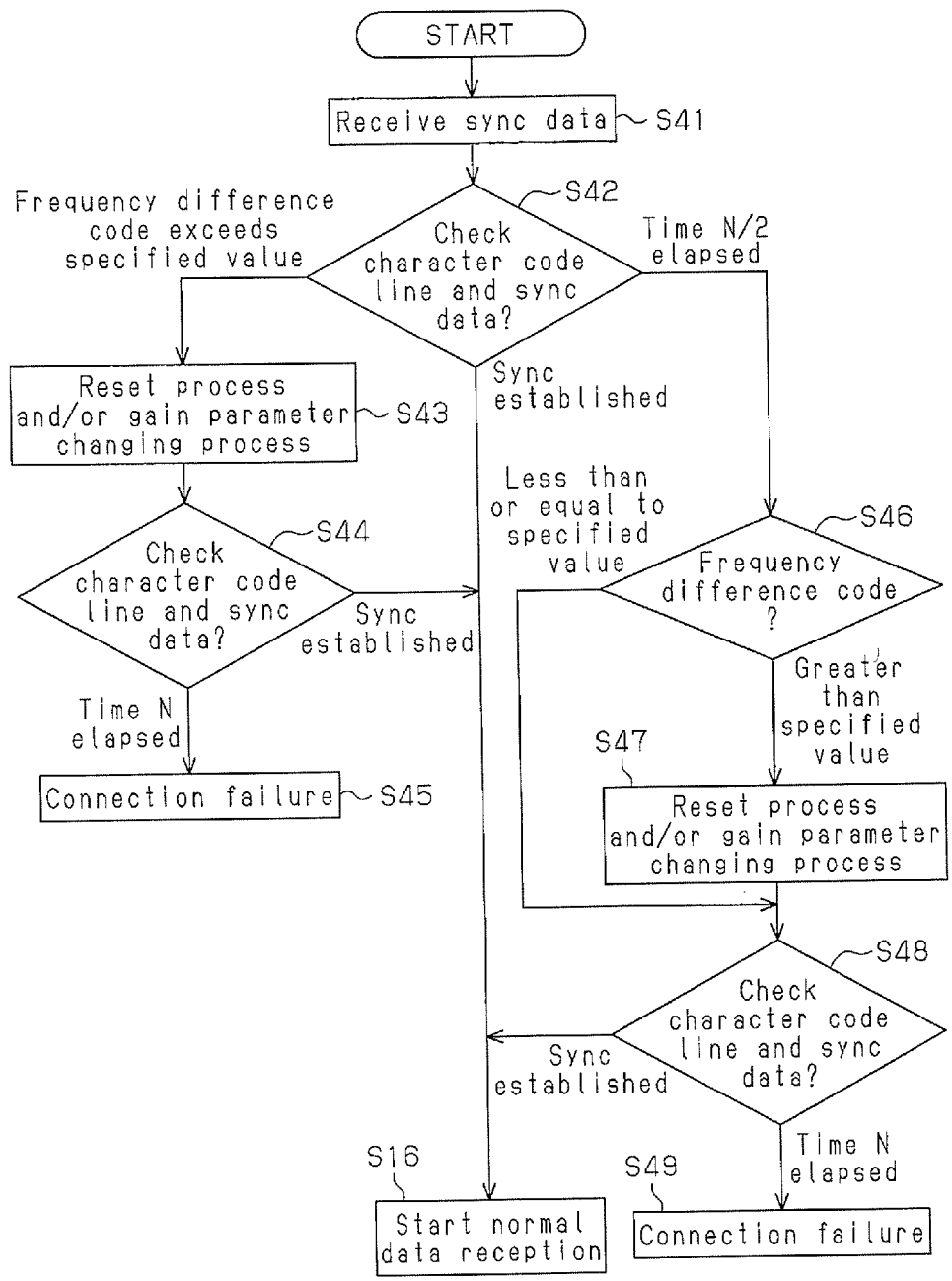
FIG. 13 is a flowchart of a process for preventing lost synchronization performed by the device shown in FIG. 12.

A process for preventing lost synchronization when starting the reception of data will now be discussed with reference to the flowchart of FIG. 13. In the same manner as in step S11 (refer to FIG. 6) of the first and second embodiments, the reception node 10 receives synchronization data (step S41).

Then, in the same manner as in step S12 of FIG. 6, the reception node 10 starts a process for detecting a character code and checks whether or not synchronization data has been normally received throughout a given period (step 42). In step S42, when determining that the frequency difference code DF has exceeded the first specified value, the reception node 10 performs a reset process and/or gain parameter changing process on the CDR circuit 12 (step S43).

In this state, the reception node 10 continues to check the character code line and synchronization data (step 44). Afterwards, during the detection time N, if the character code line is not detected or if the character code line is detected but NG data is also detected, the reception node 10 performs a connection failure process (step S45).

In step S42, during the retry determination time N/2, if the character code line is not detected or if the character code line is detected but NG data is also detected, the reception node 10 determines whether or not the frequency difference code DF is less than or equal to the second specified value DFN (step S46). If the frequency difference code DF is greater than the second specified value DFN, the reception node 10 performs the reset process and/or gain parameter changing process on the CDR circuit 12 (step S47). In this state, the reception node 10 continues to check the character code line and synchronization data (step S48).

In step S46, if the frequency difference code DF is less than or equal to the second specified value DFN, the reception node 10 proceeds to step S48. More specifically, if the frequency difference code DF is less than or equal to the second specified value DFN, the reception node 10 determines that synchronization will soon be established and does not perform the reset process or gain parameter changing process on the CDR circuit 12. During the detection time N, if the character code line is not detected or if the character code line is detected but NG data is also detected, the reception node 10 performs the connection failure process (step S49).

Further, when determining that synchronization has not been established in step S42, S44, or S48, the reception node 10 starts a normal data reception process (step S16). In the fourth embodiment, if the frequency difference code DF is less than the second specified value DFN in step S46, the synchronization process is continued in step S48. This increases the possibility of the time for the synchronization process being shortened.

In addition to the advantages of the second embodiment, the fourth embodiment has the advantage described below.

(3) When synchronization between connection nodes is not established even if the retry determination time N/2 is elapsed from when data reception is started, the reception node 10 determines whether or not the frequency difference code DF is less than the specified value DFN. If the frequency difference code DF is less than the specified value DFN, the reception node 10 determines that synchronization will soon be established and prohibits the execution of a process (reset process and/or gain parameter changing process) for correcting the operation of the CDR circuit 12. This prevents the synchronization process from being retried when unnecessary and thus shortens the time required for the synchronization process. In this manner, time (retry determination time) and the frequency difference code DF are both used to determine whether or not to perform a resynchronization process. Thus, a resynchronization process can be efficiently performed.

A device and method for preventing synchronization loss according to a fifth embodiment will now be discussed with reference to the drawings. The fifth embodiment differs from the first embodiment in that a microcomputer (firmware) is used in lieu of hardware that performs the process for preventing connection failures.

Figure 14:
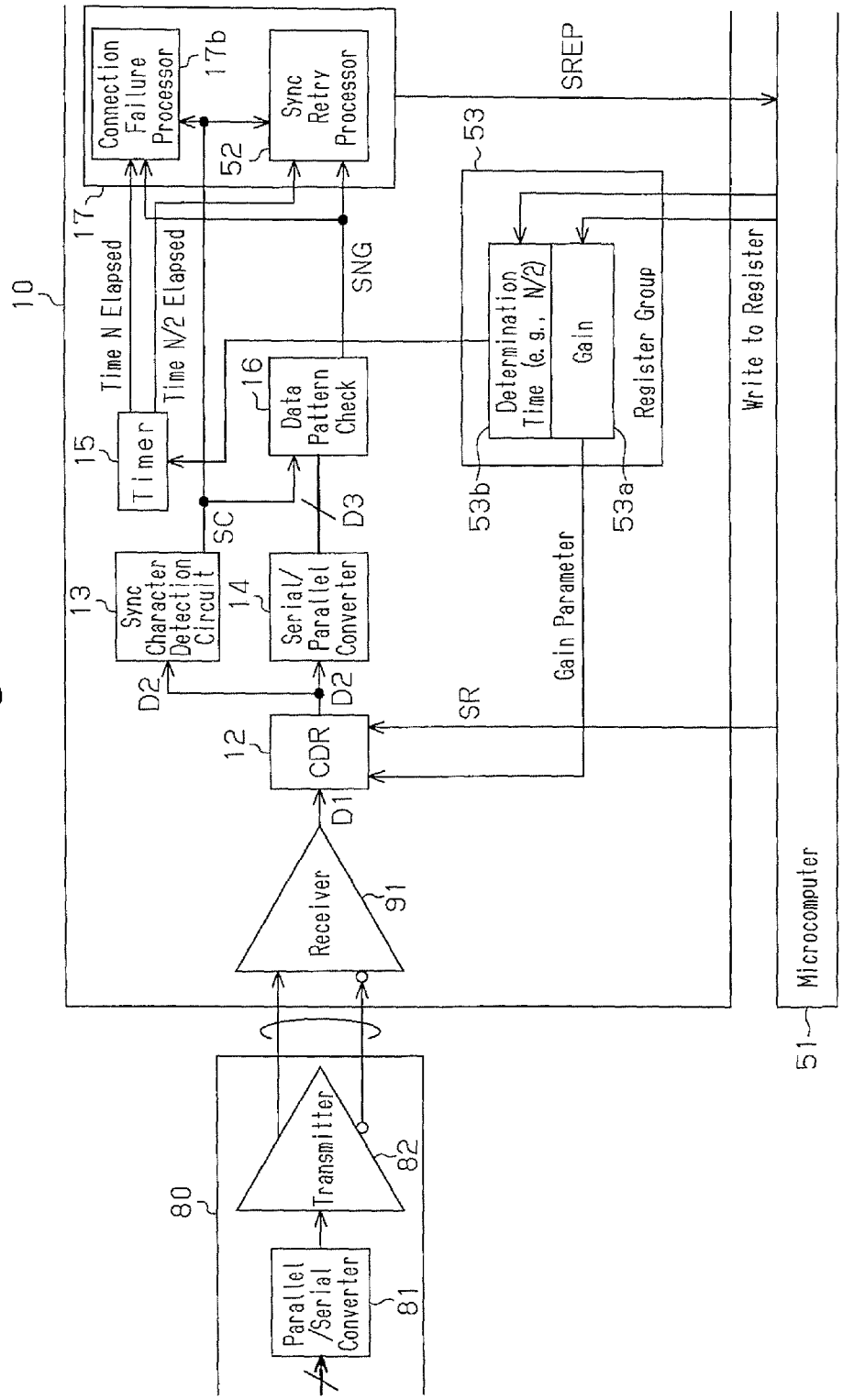
FIG. 14 is a schematic block circuit diagram of a device that prevents lost synchronization according to a fifth embodiment.

The reception node 10 (controller) shown in FIG. 14 differs from that shown in FIG. 3 in that a microcomputer 51 is included. The sequencer 17 includes a retry processor 52. During the retry determination time N/2, if the character code line is not detected or if the character code line is detected but NG data is also detected, the retry processor 52 outputs a retry notification signal SREP to the microcomputer 51. In the fifth embodiment, the retry processor 52 functions as a notification unit.

Further, the reception node 10 has a register group 53, which includes a register 53a and a register 53b. The register 53a stores the gain parameter (response sensitivity) set for the CDR circuit 12, and the register 53b stores the retry determination time (e.g., N/2) set for the timer circuit 15. The gain parameter and retry determination time stored in the register group 53 can be varied by the microcomputer 51. Further, the microcomputer 51 provides the CDR circuit 12 with a reset signal SR.

A process for preventing lost synchronization when starting the reception of data will now be discussed with reference to the flowchart of FIG. 15. The microcomputer 51 initializes the register group 53 and writes the retry determination time to the register 53b (step S51). In the same manner as step S11 (refer to FIG. 6) in the first embodiment, the reception node 10 receives initialization data (step S52).

Subsequently, in the same manner as in step S12 of FIG. 6, the reception node 10 starts a process for detecting a character code line, and then checks whether or not synchronization data has been normally received throughout a given period (step S53). Afterwards, during the retry determination time set by the microcomputer 51, if the character code line is not detected or if the character code line is detected but NG data is also detected, the reception node 10 outputs the retry notification signal SREP to the microcomputer 51 (step S54).

In response to the retry notification signal SREP, the microcomputer 51 performs a reset process on the CDR circuit 12 and/or a gain parameter changing process with the register group 53 (step S55). Thereafter, the reception node 10 continues to check the character code line and the synchronization data (step S14). The reception node 10 starts the normal data reception process (step S16) when determining in step S53 and step S14 that synchronization has been established. The reception node performs the connection failure process (step S15) when determining that synchronization has not been established.

In addition to the advantages of the first embodiment, the fifth embodiment has the advantages described below.

(4) The operation of the CDR circuit 12 is corrected by the microcomputer 51 (firmware). Thus, in comparison with a process performed by hardware as in the first embodiment, variations for performing a correction process can be increased.

For example, to increase the number of times the operation of the CDR circuit 12 is corrected, the microcomputer 51 may sequentially renew the retry determination time stored in the register 53b in the manner of "1/3N, 2/3N, . . . 1".

Further, while once evaluating a completed device, the microcomputer 51 may properly change diameters such as the retry determination time. This enables the synchronization process to be performed further properly.

(5) The value of the register 53a is rewritable by the microcomputer 51. Thus, the microcomputer 51 may change the gain parameter (response sensitivity) of the CDR circuit 12 with the single register 53a. Accordingly, the circuit configuration can be simplified in comparison to when using a register group including, for example, a plurality of registers to store a plurality of selectable gain parameters.

A device and method for preventing synchronization loss according to a sixth embodiment will now be discussed with reference to the drawings. The sixth embodiment differs from the second embodiment in that a microcomputer (firmware) is used in lieu of hardware that performs the process for preventing connection failures.

Figure 16:
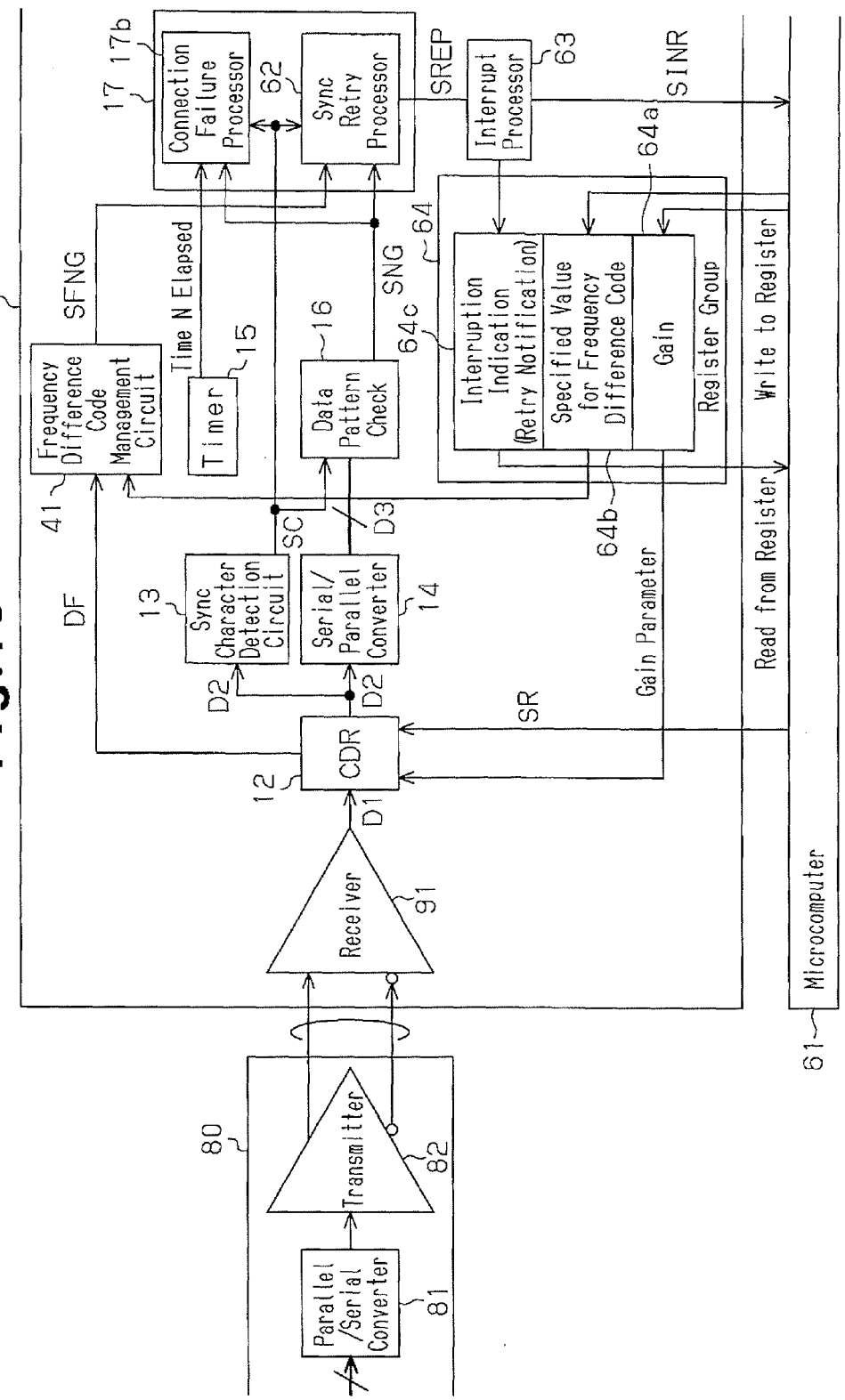
FIG. 16 is a schematic block circuit diagram of a device that prevents lost synchronization according to a sixth embodiment.

The reception node 10 (controller) shown in FIG. 16 differs from that shown in FIG. 9 in that a microcomputer 61 is included. The sequencer 17 includes a retry processor 62. When the frequency difference code DF exceeds a specified value, the retry processor 62 provides a retry notification signal SREP to an interrupt processor 63, which is arranged in the reception node 10.

In response to the retry notification signal SREP, the interrupt processor 63 generates, or activates, an interrupt signal SINR and provides the microcomputer 51 with the interrupt signal SINR. In the sixth embodiment, the retry processor 62 and the interrupt processor 63 function as a notification unit.

The reception node 10 has a register group 64, which includes a register 64a, a register 64b, and an instruction register 64c. The register 64a stores the gain parameter (response sensitivity) set for the CDR circuit 12. The register 64b stores the specified value set for the management circuit 41. The instruction register 64c stores the content of the interrupt notified to the management circuit 41. In response to the retry notification signal SREP, the interrupt processor 63 notifies the instruction register 64c of the interrupt content. In response to the interrupt signal SINR, the microcomputer 61 performs a retry process based on the information instructed by the instruction register 64c. The fifth embodiment notifies the microcomputer of a retry with the external signal, whereas the sixth embodiment notifies the microcomputer 61 of a retry with the external interrupt signal SINR. Since an external signal is not used for retry notification, external terminals of the microcomputer 61 and the reception node 10 can be reduced.

The gain parameter and specified value of the frequency difference code DF stored in the register group 64 may be varied by the microcomputer 61. Further, the reset signal SR is provided from the microcomputer 61 to the CDR circuit 12. In FIG. 16, the reset signal SR may be allocated to the register group 64 although it is an external signal. By providing the reset signal SR from the microcomputer 61 to the reception node 10 via the register group 64, the terminals for the reset signal SR can be reduced.

Figure 15:
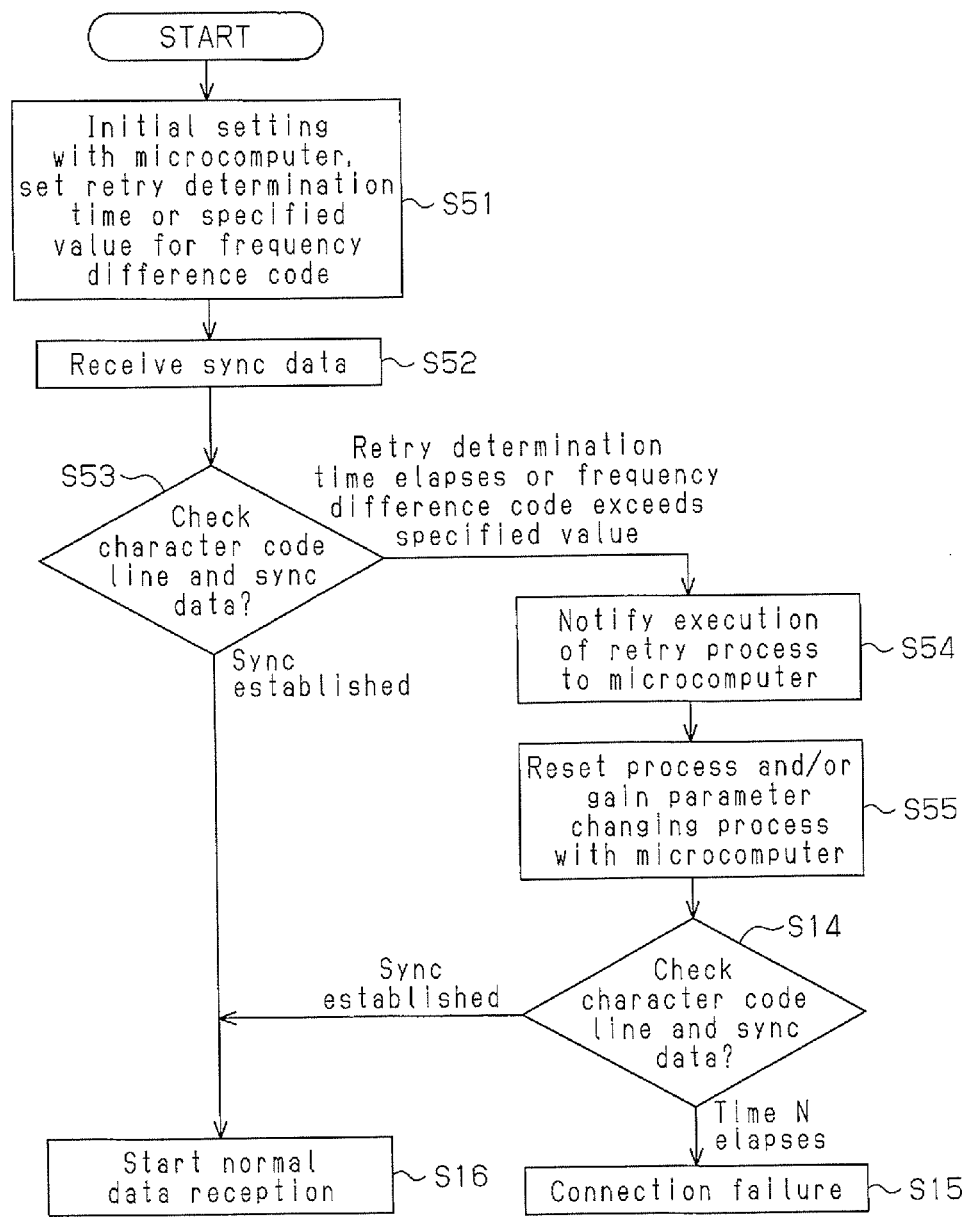
FIG. 15 is a flowchart of a process for preventing lost synchronization performed by the device shown in FIG. 14.

In the sixth embodiment, a process for preventing lost synchronization is performed in the same manner as that illustrated in the flowchart of FIG. 15 except in that partial changes are made to steps S51, S53, and S54. Specifically, in step S51, the microcomputer 61 sets the specified value of the frequency difference code DF instead of the retry determination time. In step S53, when detecting that the frequency difference code DF has exceeded the specified value, the reception node 10 performs a reset process and/or gain parameter changing process on the CDR circuit 12. In step S54, instead of the external signal SREP shown in FIG. 14, the reception node 10 provides the external interrupt signal SINR to the microcomputer 61. In the sixth embodiment, the retry process (reset process and/or gain parameter changing process) may be performed on the CDR circuit 12 for any number of times whenever the detection signal SFNG is detected during the detection time N.

In addition to the advantages of the second embodiment and advantages (4) and (5) of the fifth embodiment, the sixth embodiment has the advantage described below.

In response to the interrupt signal SINR, the microcomputer 61 controls the correction process performed on the CDR circuit 12. Accordingly, in comparison with when notifying a retry to the microcomputer 51 with an exclusive external signal (retry notification signal SREP) as, for example, in the fifth embodiment (FIG. 14), the external terminals of the microcomputer 61 and the reception node 10 can be reduced.

A device and method for preventing synchronization loss according to a seventh embodiment will now be discussed with reference to the drawings. The seventh embodiment differs from the third embodiment in that a microcomputer (firmware) is used in lieu of hardware that performs the process for preventing connection failures.

Figure 17:
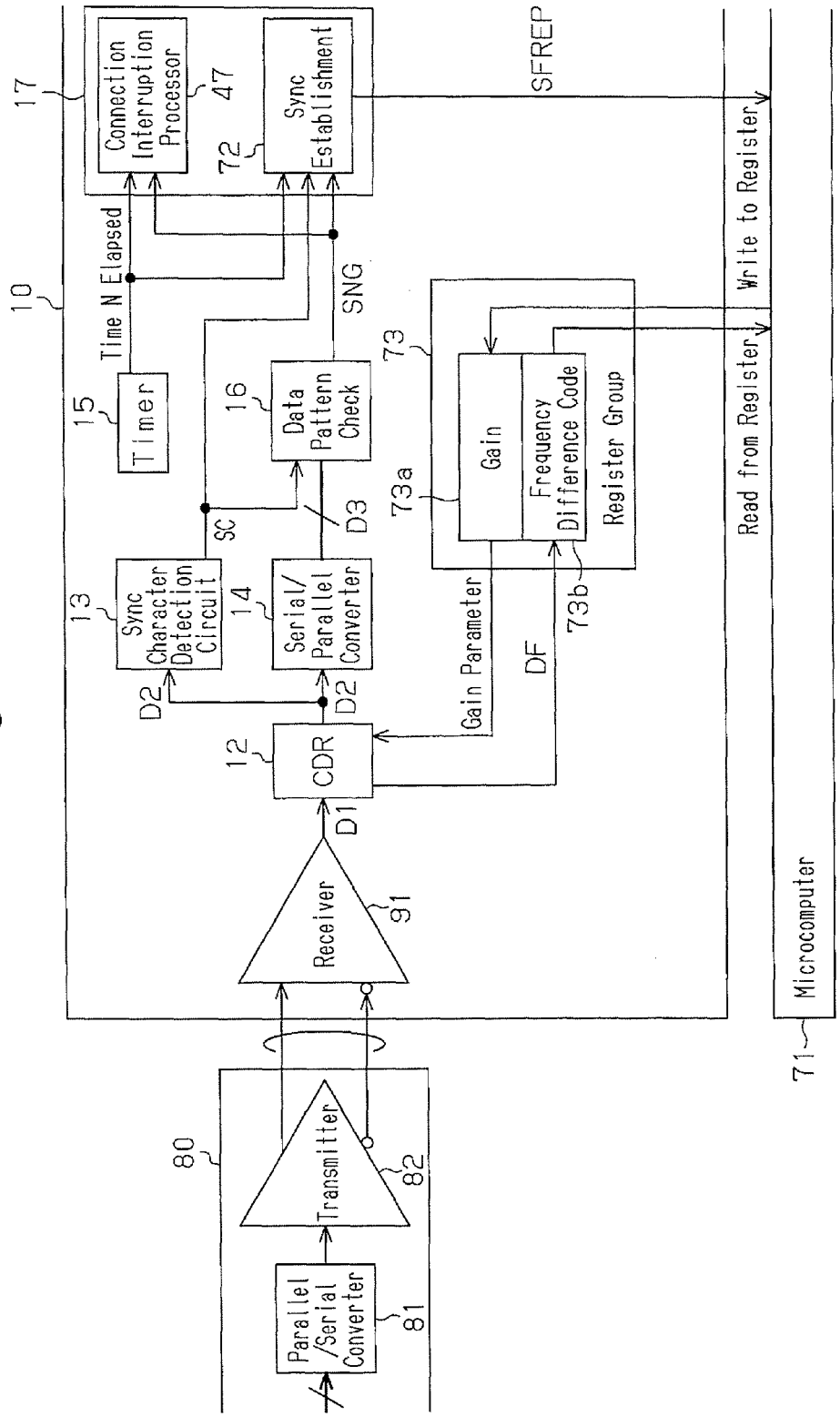
FIG. 17 is a schematic block circuit diagram of a device that prevents lost synchronization according to a seventh embodiment.

The reception node 10 (controller) shown in FIG. 17 differs from that shown in FIG. 9 in that a microcomputer 71 is included. The sequencer 17 includes a synchronization establishment unit 72, which provides the microcomputer 71 with an establishment notification signal SFREP when recognizing synchronization establishment. In the seventh embodiment, the synchronization establishment unit 72 functions as a notification unit.

The reception node 10 has a register group 73, which includes a register 73a and an instruction register 73b. The register 73a stores the gain parameter (response sensitivity) set for the CDR circuit 12, and the instruction register 73b stores the frequency difference code DF output from the CDR circuit 12. The gain parameter stored in the register 73a may be varied by the microcomputer 71. The frequency difference code DF stored in the instruction register 73b is readable by the microcomputer 71.

In response to the establishment notification signal SFREP, the microcomputer 71 reads the frequency difference code DF of the instruction register 73b and computes the gain parameter of the CDR circuit 12 based on the read frequency difference code DF. The microcomputer 71 writes the computed gain parameter to the register 73a. The gain parameter, which is a value that is smaller than an initial gain parameter until synchronization is established, is calculated, for example, to become larger as the frequency difference code DF becomes larger. In this manner, after synchronization establishment, the microcomputer 71 sets a gain parameter that is smaller than the initial gain parameter for the CDR circuit 12 after synchronization establishment. This makes it difficult for the CDR circuit 12 to follow noise. Thus, connection interruptions after synchronization establishment are prevented.

A process for preventing lost synchronization in the seventh embodiment will now be discussed with reference to the flowchart of FIG. 18. After synchronization establishment, the microcomputer 71 outputs the establishment notification signal SFREP (step S71). Then, the microcomputer 71 performs a process for setting the gain parameter after synchronization establishment (step S72). Specifically, the microcomputer 71 computes a gain parameter of the CDR circuit 12 based on the frequency difference code DF of the instruction register 73b and writes the computed gain parameter to the register 73a. After changing the gain parameter with the microcomputer 71, the same processes as in the third embodiment (steps S32 to S34) are performed.

In addition to the advantages of the third embodiment, the seventh embodiment has the advantages described below.

(3) The response sensitivity (gain) of the CDR circuit 12 is lowered by the microcomputer 71 (firmware). This increases variations in gain setting processes compared to when using hardware to perform processes as in the third embodiment.

Further, while once evaluating a completed device, the microcomputer 71 may properly change, for example, the equation for computing the gain parameter. This enables the gain setting process to be performed further properly.

(4) The value of the register 73a is readable by the microcomputer 71. Thus, the microcomputer 71 may change the gain parameter (response sensitivity) of the CDR circuit 12 with the single register 73a. Accordingly, the circuit configuration can be simplified in comparison to when using a register group including, for example, a plurality of registers to store a plurality of selectable gain parameters.

It should be apparent to those skilled in the art that the embodiments may be embodied in many other specific forms without departing from the spirit or scope of the aforementioned embodiments. Particularly, it should be understood that the embodiments may be embodied in the following forms.

In the first embodiment, the retry determination time is not limited to time N/2 and may be any other value that is shorter than the detection time N. This is the same in the second embodiment.

In the first embodiment, the synchronization detection time may be divided into a plurality of synchronization detection times such as N/3, N/4, . . . , N. In this case, the retry processor 17a may perform a retry process (reset process and/or gain parameter changing process) on the CDR circuit 12 whenever any one of the detection times N/3, N/4, . . . , N elapses. This repeats the retry process within the detection time N until synchronization is established. This further ensures that connection failures are prevented.

In the first embodiment, the retry process performed on the CDR circuit 12 includes at least either one of the reset process and the gain parameter changing process. When performing only either one of the reset process and the gain parameter changing process, there is a high possibility that the reset process would be more effective. This is the same in the second embodiment.

In the second embodiment, the retry processor 17a may perform the retry process (reset process and/or gain parameter changing process) on the CDR circuit 12 whenever detecting the detection signal SFNG before the detection time N elapses. This repeats the retry process until synchronization is established within the detection time N.

In the second embodiment, the retry gain parameter may be changed in accordance with the frequency difference code DF.

In the third embodiment, the frequency difference code DF may be recorded in a register so that it can be read by a microcomputer. In this case, the adjustment gain parameter may be set to any value in accordance with the register value read by the microcomputer.

The synchronization process with the CDR circuit 12 may be performed by combining all of the configurations shown in FIGS. 3, 9, and 10. In this case, a retry process based on the retry determination time N/2, a retry process based on the detection time SFNG (frequency difference code DF), and gain adjustment using an adjustment gain parameter after synchronization establishment may be performed. This prevents connection failures within the detection time N and prevents synchronization from being lost due to noise after synchronization establishment.

In the fourth embodiment (FIG. 12), the process for preventing connection failures may be performed by a microcomputer (firmware) instead of hardware. In this case, notifications from the retry processor (17a) to the microcomputer may be performed by an exclusive signal (retry notification signal SREP) as in FIG. 14 or an interrupt signal (SINR) as in FIG. 16.

In the fifth embodiment (FIG. 14), the notification from the retry processor (62) to the microcomputer may be performed by an interrupt signal (SINR) as shown in FIG. 16.

In the sixth embodiment (FIG. 16), the notification from the retry processor (62) to the microcomputer may be performed by an exclusive signal (retry notification signal SREP) as shown in FIG. 14.

In the seventh embodiment (FIG. 17), the notification from the synchronization establishment unit (72) to the microcomputer may be performed by an interrupt signal as shown in FIG. 16.

In the seventh embodiment (FIG. 17), the microcomputer 71 may select one of a plurality of pre-registered gains based on the frequency difference code DF read from the instruction register 73b and write the selected gain to the register 73a.

The present examples and embodiments are to be considered as illustrative and not restrictive, and the embodiments are not to be limited to the details given herein, but may be modified within the scope and equivalence of the appended claims.

The invention claimed is:

1. A method for synchronizing two connection nodes, the method comprising:
   setting a maximum synchronization detection time between a transmission node and a reception node;
   determining that the transmission node and reception node are synchronized at an early detection time, wherein the early detection time is less than the maximum synchronization detection time;
   correcting a clock data recovery circuit when the transmission node and the reception node are unsynchronized to perform a resynchronization process; and
   performing the resynchronization process based on the corrected clock data recovery circuit to establish synchronization between the transmission node and the reception node before the maximum synchronization detection time is reached.

2. The method according to claim 1, wherein the correcting includes resetting the clock data recovery circuit.

3. The method according to claim 2, wherein the correcting includes repeating the resetting within the maximum synchronization detection time until the synchronization is established.

4. The method according to claim 1, wherein the correcting includes increasing a response sensitivity of the clock data recovery circuit.

5. The method according to claim 4, wherein the correcting includes repeating the increasing the response sensitivity within the maximum synchronization detection time until the synchronization is established.

6. The method according to claim 5, further comprising:
   decreasing the response sensitivity after the synchronization is established.

7. The method according to claim 6, further comprising:
   setting the response sensitivity of the clock data recovery circuit with an initial gain parameter, wherein:
      the increasing the response sensitivity includes setting the response sensitivity of the clock data recovery circuit with a first gain parameter that is greater than the initial gain parameter; and
      the decreasing the response sensitivity includes setting the response sensitivity of the clock data recovery circuit with a second gain parameter that is less than the initial gain parameter.

8. The method according to claim 1, wherein the connection nodes operate at a first frequency and a second frequency, respectively, the method further comprising:
   detecting a frequency difference between the connection nodes; and
   correcting the clock data recovery circuit when the detected frequency difference exceeds a tolerance value within the maximum synchronization detection time.

9. The method according to claim 1, further comprising:
   performing a connection interruption process when the synchronization is lost after the synchronization is once established; and
   changing a response sensitivity of the clock data recovery circuit at least including decreasing the response sensitivity of the clock data recovery circuit after the synchronization is established.

10. The method according to claim 1, further comprising determining a connection failure between the transmission node and the reception node when the resynchronization process is not completed before the maximum synchronization detection time is reached.

11. A device, the device comprising:
   a clock data recovery circuit configured to generate a synchronization clock from input data;
   a synchronization detection circuit configured to determine that transmission node and a reception node are synchronized at an early detection time, wherein the early detection time is less than a maximum synchronization detection time and to generate a synchronization detection signal;
   a timer circuit configured to set the maximum synchronization detection time and the early detection time;
   a correction processor configured to correct the clock data recovery circuit based on the synchronization detection signal; and
   a resynchronization processor configured to perform a resynchronization process based on the corrected clock data recovery circuit to establish synchronization between the transmission and reception nodes before the maximum synchronization detection time is reached.

12. The device according to claim 11, further comprising:
   a frequency difference detection unit configured to detect a frequency difference between the input data and the synchronization clock and to generate a frequency difference signal, wherein the correction processor is further configured to correct the clock data recovery circuit in accordance with the frequency difference signal and the maximum synchronization detection time.

13. The device according to claim 11, further comprising:
   a data string detection circuit configured to detects a state of a string of the input data and generates a data string detection signal;
   a connection interruption processor configured to perform a connection interruption process in accordance with the data string detection signal; and
   a response sensitivity changing unit configured to change the response sensitivity of the clock data recovery circuit at least including decreasing the response sensitivity of the clock data recovery circuit in accordance with the synchronization detection signal.

14. The device according to claim 11, wherein the correction processor includes:
   a microcomputer; and
   a notification unit configured to notify the microcomputer of a retry notification signal when the synchronization is not established when the early detection time elapses,
   wherein the microcomputer corrects the clock data recovery circuit in response to the retry notification signal.

15. The device according to claim 14, wherein:
   the correction processor further includes a register configured to store a response sensitivity set for the clock data recovery circuit; and
   the microcomputer is configured to rewrite the register to increase the response sensitivity in response to the retry notification signal.

16. The device according to claim 14, wherein the notification unit includes an interrupt processor configured to generate the retry notification signal as an interrupt signal provided to the microcomputer.

* * * * *